(12) United States Patent
Hwang et al.

(10) Patent No.: US 10,942,805 B2
(45) Date of Patent: Mar. 9, 2021

(54) ERROR CORRECTING CIRCUIT PERFORMING ERROR CORRECTION ON USER DATA AND ERROR CORRECTING METHOD USING THE ERROR CORRECTING CIRCUIT

(71) Applicant: SAMSUNG ELECTRONICS CO., LTD., Suwon-si (KR)

(72) Inventors: Young-Jun Hwang, Hwaseong-si (KR); Myung-Kyu Lee, Seoul (KR); Hong-Rak Son, Anyang-si (KR); Geun-Yeong Yu, Seongnam-si (KR); Ki-Jun Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/444,056

(22) Filed: Jun. 18, 2019

(65) Prior Publication Data

US 2020/0042385 A1 Feb. 6, 2020

(30) Foreign Application Priority Data

Aug. 3, 2018 (KR) ........................ 10-2018-0090908

(51) Int. Cl.
*G06F 11/10* (2006.01)
*G11C 29/52* (2006.01)

(52) U.S. Cl.
CPC .......... *G06F 11/1068* (2013.01); *G11C 29/52* (2013.01)

(58) Field of Classification Search
CPC .................................. G06F 11/1068

USPC ................. 714/764, 765, 768, 770
See application file for complete search history.

(56) References Cited

U.S. PATENT DOCUMENTS

| | | | |
|---|---|---|---|
| 5,103,451 A | 4/1992 | Fossey | |
| 6,982,659 B2 | 1/2006 | Shen et al. | |
| 7,181,671 B2 | 2/2007 | Tsai et al. | |
| 7,320,101 B1 | 1/2008 | Bain | |
| 2014/0201596 A1 | 7/2014 | Baum et al. | |
| 2015/0301887 A1* | 10/2015 | Zhang | H03M 13/114 714/764 |
| 2015/0303942 A1* | 10/2015 | Zhang | H03M 13/1117 714/763 |
| 2016/0162353 A1* | 6/2016 | Manohar | G06F 11/1048 714/760 |
| 2016/0336964 A1 | 11/2016 | Khalil et al. | |
| 2017/0075754 A1 | 3/2017 | Wang | |

* cited by examiner

*Primary Examiner* — Fritz Alphonse
(74) *Attorney, Agent, or Firm* — F. Chau & Associates, LLC

(57) ABSTRACT

An error correcting circuit receives a codeword including user data and a parity code, and performs an error correction operation on the user data. The circuit includes a first buffer, a decoder, a second buffer and a processor. The first buffer stores the codeword and sequentially outputs pieces of subgroup data obtained by dividing the codeword. The decoder generates pieces of integrity data for each of the pieces of subgroup data received from the first buffer, and performs the error correction operation on the user data using the parity code. The second buffer sequentially stores the pieces of integrity data for each of the pieces of subgroup data. The processor determines whether an error is present in the codeword based on the pieces of integrity data stored in the second buffer when at least one of the pieces of integrity data is updated in the second buffer.

20 Claims, 16 Drawing Sheets

ERROR CORRECTING CIRCUIT PERFORMING ERROR CORRECTION ON USER DATA AND ERROR CORRECTING METHOD USING THE ERROR CORRECTING CIRCUIT

CROSS-REFERENCE TO RELATED APPLICATIONS

This application claims priority under 35 U.S.C. § 119 to Korean Patent Application No. 10-2018-0090908, filed on Aug. 3, 2018 in the Korean Intellectual Property Office, the disclosure of which is incorporated by reference herein in its entirety.

TECHNICAL FIELD

Exemplary embodiments of the present inventive concept relate to a semiconductor circuit, and more particularly, to an error correcting circuit performing an error correction operation on user data and a memory controller including the error correcting circuit.

DISCUSSION OF THE RELATED ART

A semiconductor storage device is a device that stores data under the control of a host device such as a computer, a smartphone, a smartpad, etc. The storage device may be, for example, a device that stores data on a magnetic disk such as a hard disk drive (HDD) or a solid state drive (SSD), or a device that stores data on a semiconductor memory device such as a memory card, particularly, on a nonvolatile memory.

The nonvolatile memory may include, for example, read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), ferroelectric RAM (FRAM), etc.

With the advancement of semiconductor manufacturing technology, such a storage device is being continuously improved to have high integration and increased capacity. High integration of the storage device has the benefit of reducing production cost of the storage device. However, due to the high integration of the storage device, the scale of the storage device has been reduced, which may result in, for example, an increased error rate of data stored in the storage device.

SUMMARY

According to an exemplary embodiment of the present inventive concept, an error correcting circuit includes a first buffer, a decoder, a second buffer and a first processor. The first buffer is configured to store a codeword and sequentially output a plurality of pieces of subgroup data obtained by dividing the codeword. The codeword includes user data and a parity code, and the error correcting circuit is configured to receive the codeword and perform an error correction operation on the user data. The decoder is configured to generate a plurality of pieces of integrity data for each of the plurality of pieces of subgroup data received from the first buffer and perform the error correction operation on the user data using the parity code. The second buffer is configured to sequentially store the plurality of pieces of integrity data for each of the plurality of pieces of subgroup data. The first processor is configured to determine whether an error is present in the codeword based on the plurality of pieces of integrity data stored in the second buffer when at least one of the plurality of pieces of integrity data is updated in the second buffer.

According to an exemplary embodiment of the present inventive concept, an error correcting circuit includes a decoder and a first processor. The decoder is configured to sequentially generate a plurality of pieces of integrity data for each of a plurality of pieces of subgroup data obtained by dividing a codeword and repeatedly perform an error correction operation on user data using a parity code. The codeword includes the user data and the parity code, and the error correcting circuit is configured to receive the codeword and perform the error correction operation on the codeword. The first processor is configured to determine whether an error is present in the codeword based on the plurality of pieces of integrity data. The decoder is further configured to stop the error correction operation performed on the codeword based on a determination result of the first processor.

According to an exemplary embodiment of the present inventive concept, an error correcting method includes receiving a codeword including user data and a parity code, storing the codeword in a first buffer, generating a plurality of pieces of integrity data for each of a plurality of pieces of subgroup data obtained by dividing the codeword, sequentially storing the plurality of pieces of integrity data in a second buffer, and determining whether an error is present in the codeword based on the plurality of pieces of integrity data stored in the second buffer when at least one of the plurality of pieces of integrity data is updated in the second buffer.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EXEMPLARY EMBODIMENTS

Figure 1:
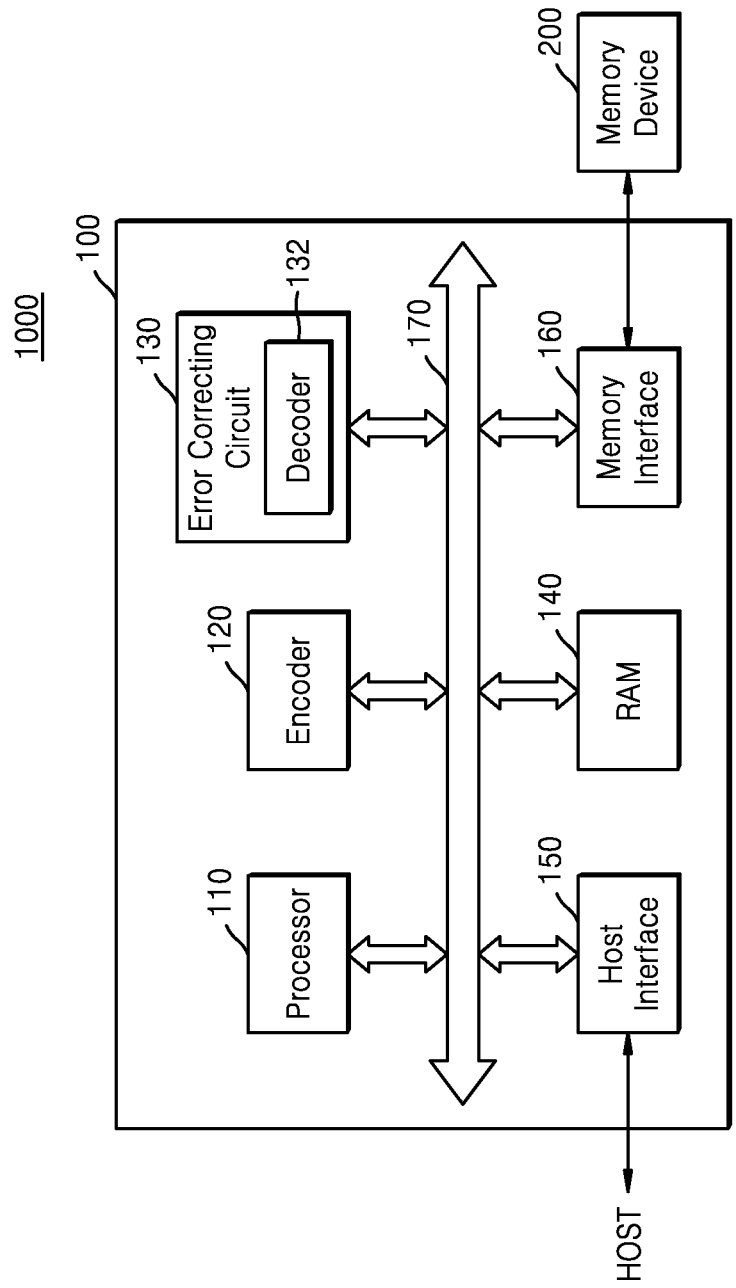
FIG. 1 is a block diagram illustrating a memory system according to an exemplary embodiment of the present inventive concept.

Exemplary embodiments of the present inventive concept will be described more fully hereinafter with reference to the accompanying drawings. Like reference numerals may refer to like elements throughout the accompanying drawings.

It will be understood that the terms "first," "second," "third," etc. are used herein to distinguish one element from another, and the elements are not limited by these terms. Thus, a "first" element in an exemplary embodiment may be described as a "second" element in another exemplary embodiment.

It should be further understood that descriptions of features or aspects within each exemplary embodiment should typically be considered as available for other similar features or aspects in other exemplary embodiments, unless the context clearly indicates otherwise.

Exemplary embodiments of the present inventive concept provide an error correcting circuit capable of determining whether a correction is completed during decoding of a codeword, and a memory controller including the error correcting circuit.

Exemplary embodiments of the present inventive concept further provide an error correcting method capable of determining whether a correction is completed during decoding of a codeword.

FIG. 1 is a block diagram illustrating a memory system 1000 according to an exemplary embodiment of the present inventive concept.

Referring to FIG. 1, the memory system 1000 may be implemented in one of a computing system such as, for example, a workstation, a netbook, a personal digital assistant (PDA), a portable computer, a computer tablet, a wireless phone, a mobile phone, a smartphone, an e-book, a portable multimedia player (PMP), a portable game machine, a navigation device, a dashboard camera, a digital camera, a digital multimedia broadcasting (DMB) player, a digital audio recorder, a digital audio player, a digital picture recorder, a digital picture player, a digital video recorder, a digital video player, etc.

The memory system 1000 may include a memory controller 100 and a memory device 200. As an example, a host, the memory controller 100, and the memory device 200 may be respectively provided as a chip, a package, a module, etc. Alternatively, the memory controller 100 and the memory device 200 may be packaged and provided as packages such as, for example, package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi chip package (MCP), wafer-level fabricated package (WFP), wafer-level processed stack package (WSP), etc.

The memory device 200 may be implemented as either a non-volatile memory device or a volatile memory device. For example, the memory device 200 may be configured as a non-volatile memory device such as NAND flash memory, vertical NAND flash memory, NOR flash memory, resistive random access memory, phase-change memory, magnetoresistive random access memory, etc., or as a volatile memory device such as static random access memory (SRAM), dynamic random access memory (DRAM), a latch, a flip-flop, a register, etc. The memory device 200 may be configured as a hybrid of at least one of non-volatile memory devices and at least one of volatile memory devices, and as the hybrid of at least two of the non-volatile memory devices or at least two of the volatile memory devices. The memory device 200 may be configured as a single flash memory chip, or as a plurality of flash memory chips.

The memory controller 100 may include a processor 110, an encoder 120, an error correcting circuit 130, random access memory (RAM) 140, a host interface 150, a memory interface 160, and a bus 170. The processor 110 may be electrically connected to the encoder 120, the error correcting circuit 130, the RAM 140, the host interface 150, and the memory interface 160 through the bus 170. The bus 170 may refer to an electrical transmission line that transmits information among constituent parts of the memory controller 100.

The processor 110 may control overall operations of the memory system 1000. For example, the processor 110 may control the memory system 1000 to decode commands received from the host and to perform an operation according to a decoding result. The processor 110 may provide a read command and an address to the memory device 200 during a read operation, and may provide a write command, an address, and an encoded codeword to the memory device 200 during a write operation. In addition, the processor 110 may perform a process of converting a logical address received from the host into a physical page address using metadata stored in the RAM 140.

Data transmitted from the host and data generated by the processor 110 may be temporarily stored in the RAM 140, or data read from the memory device 200 may be temporarily stored in the RAM 140. Also, the metadata read from the memory device 200 is stored in the RAM 140. The RAM 140 may be implemented as, for example, DRAM, SRAM, etc. The metadata may be information generated by the memory system 1000 that is used to manage the memory device 200. When the metadata is management information, the metadata may include mapping table information used to convert a logical address into a physical page address of the memory device 200. As an example, the metadata may include page mapping table information used to perform an address mapping operation on a page basis. Moreover, the metadata may include information used to manage storage space of the memory device 200.

The host interface 150 may have a data exchange protocol with the host which accesses the memory device 200, and may connect the memory device 200 to the host. The host interface 150 may be implemented as, for example, an Advanced Technology Attachment (ATA) interface, a Serial Advanced Technology Attachment (SATA) interface, a Parallel Advanced Technology Attachment (PATA) interface, a Universal Serial Bus (USB) or Serial Attached Small (SAS) Computer System interface, a Small Computer System Interface (SCSI), an embedded Multi Media Card (eMMC) interface, or a Unix File System (UFS) interface. However, exemplary embodiments of the present inventive concept are not limited thereto. The host interface 150 may exchange a command, an address, and data with the host in accordance with the control of the processor 110.

The memory interface 160 may be electrically connected to the memory device 200. As an example, the memory interface 160 may be configured to support an interface with a NAND flash memory chip or a NOR flash memory chip. The memory interface 160 may be configured to selectively perform software and hardware interleave operations via a plurality of channels.

The processor 110 may control the memory system 1000 to read the metadata stored in the memory device 200 and store the metadata in the RAM 140 when the memory system 1000 is powered on. The processor 110 may control the memory system 1000 to update the metadata stored in the RAM 140 according to an operation of invoking a change of the metadata in the memory device 200. In addition, the processor 110 may control the memory system 1000 to write the metadata stored in the RAM 140 to the memory device 200 before the memory system 1000 is powered off.

The processor 110 may control the memory controller 100 to encode an information word received from the host at the encoder 120 by using, for example, Low Density Parity Code (LDPC) during a write operation, and to decode data read from the memory device 200 at the error correcting circuit 130 by using the LDPC during a read operation.

The encoder 120 may generate a codeword by appending a plurality of parity bits specified by the LDPC to user data received by the host. The parity bits included in the codeword may be set to comply with the LDPC.

The error correcting circuit 130 may include a decoder 132. The decoder 132 may recover the user data by decoding data read from the memory device 200 with the codeword as a unit. As an example, the decoder 132 may decode the user data by using the LDPC. The LDPC may be represented by a bipartite graph called a Tanner graph. For example, referring to a Tanner graph, an edge is able to connect variable nodes only to check nodes, and is unable to connect a variable node to another variable node or to connect a check node to another check node. In such a graph, a set of nodes such as variable nodes may correspond to bits of a codeword and to a set of other nodes, and constraint nodes named as check nodes may correspond to a set of parity check constraints that define a code.

According to an exemplary embodiment of the present inventive concept, the error correcting circuit 130 may divide the codeword into subgroup data, and, by determining whether an error exists for the subgroup data, the decoder 132 may stop a decoding process and output the codeword to the host based on a determination result of the error even when the decoder 132 is decoding the codeword. Since the decoding process may be stopped after decoding just a part of the entire codeword, rather than decoding the entire codeword, performance of the decoding process may be improved and power consumption may be reduced. This will be described in further detail with reference to FIG. 2 and FIGS. 6A and 6B.

Although the error correcting circuit 130 of FIG. 1 includes only the decoder 132, in an exemplary embodiment, the error correcting circuit 130 may include both the encoder 120 and the decoder 132.

Figure 2:
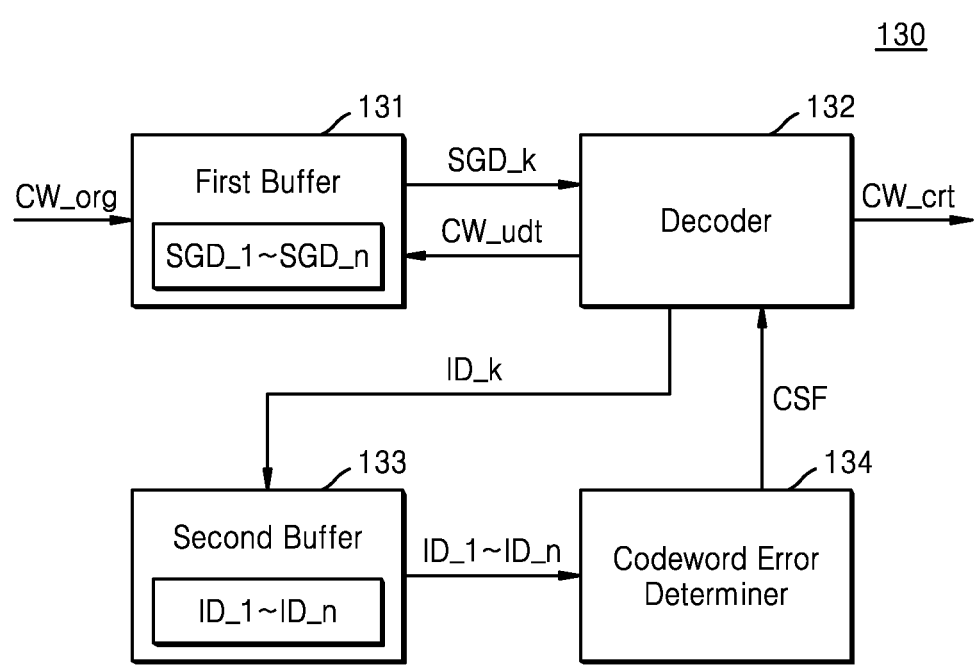
FIG. 2 is a block diagram illustrating an error correcting circuit according to an exemplary embodiment of the present inventive concept.

FIG. 2 is a block diagram illustrating the error correcting circuit 130 according to an exemplary embodiment of the present inventive concept. For convenience of explanation, a further description of components and technical aspects previously described with reference to FIG. 1 may be omitted.

Referring to FIG. 2, the error correcting circuit 130 may include a first buffer 131, the decoder 132, a second buffer 133, and a codeword error determiner 134. The first buffer 131 may include a memory element capable of storing data. As an example, the first buffer 131 may be configured as a volatile memory device such as SRAM, DRAM, a latch, a flip-flop, or a register. The first buffer 131 may receive an original codeword CW_org from the memory device 200. Moreover, the first buffer 131 may receive an updated codeword CW_udt, on which the decoding is performed, from the decoder 132.

The first buffer 131 may sequentially output to the decoder 132 first subgroup data SGD_1 to n-th subgroup data SGD_n, which are obtained by dividing a data stream of the original codeword CW_org or the updated codeword CW_udt into a unit of a certain length of data.

The decoder 132 may receive the k-th subgroup data SGD_k obtained by dividing the original codeword CW_org or the updated codeword CW_udt, where k is an integer equal to or greater than 1 and equal to or less than n, and n is an integer equal to or greater than 1, and may decode the received k-th subgroup data SGD_k. As lengths of the codewords CW_org and CW_udt increase, a decoding process which is performed in units of the subgroup data obtained by dividing the codewords CW_org, CW_udt may be performed to improve the speed of the decoder 132 and to reduce the area thereof.

According to an exemplary embodiment of the present inventive concept, the decoder 132 may perform iterative decoding on one codeword. As an example, after decoding the original codeword CW_org received from the outside (e.g., received from the memory device 200 of FIG. 1), when an error correction is not completed, the decoder 132 may store in the first buffer 131 the updated codeword CW_udt on which the error correction is primarily performed, and may perform the decoding process again using the updated codeword CW_udt.

For example, the decoder 132 may perform the decoding process on all of the subgroup data SGD_1 to SGD_n obtained by dividing the original codeword CW_org, and may determine whether the error correction is completed. As an example, the decoder 132 may determine whether the error correction is completed by using a parity code included in the original codeword CW_org. The decoder 132 may store the updated codeword CW_udt in the first buffer 131, and may sequentially perform the decoding process on a plurality of pieces of subgroup data obtained by dividing the updated codeword CW_udt when the error correction operation performed on the original codeword CW_org is not completed. The decoder 132 may output a corrected codeword CW_crt to the outside (e.g., to the host of FIG. 1) when the error correction operation performed on the codewords CW_org, CW_udt is completed.

The decoder 132 may generate k-th integrity data ID_k that includes information regarding whether there is an error present in the k-th subgroup data SGD_k during the decoding process, and may store the generated k-th integrity data ID_k in the second buffer 133.

As an example, when the decoder 132 completes the decoding process for the original codeword CW_org, the first integrity data ID_1 to the n-th integrity data ID_n may be stored in the second buffer 133. Then, the decoder 132 may update the k-th integrity data ID_k when the decoder 132 performs the decoding process on the k-th subgroup data SGD_k selected among the plurality of pieces of subgroup data SGD_1 to SGD_n obtained by the decoder 132 dividing the updated codeword CW_udt.

When the k-th integrity data ID_k stored in the second buffer 133 is updated, the codeword error determiner 134 may output a correction stop signal CSF to the decoder 132 based on a plurality of pieces of integrity data ID_1 to ID_n that are updated.

In an exemplary embodiment, each of the first integrity data ID_1 to the n-th integrity data ID_n may include information regarding the existence of an error in the first subgroup data SGD_1 to the n-th subgroup data SGD_n that respectively correspond thereto, and the codeword error determiner 134 may determine whether an error correction operation performed on the updated codeword CW_udt is completed or whether there is no error present in the updated codeword CW_udt based on the first integrity data ID_1 to the n-th integrity data ID_n.

When the codeword error determiner 134 determines that the error correction operation performed on the updated codeword CW_udt is completed based on the first integrity data ID_1 to the n-th integrity data ID_n, the codeword error determiner 134 may output the correction stop signal CSF to the decoder 132, and correspondingly, the decoder 132 may promptly output to the host the updated codeword CW_udt stored in the first buffer 131 as the corrected codeword CW_crt without performing an additional decoding process for the plurality of pieces of subgroup data SGD_1 to SGD_n.

According to an exemplary embodiment of the present inventive concept, the codeword error determiner 134 determines whether the error correction is completed before the decoding process of the decoder 132 for the codewords CW_org, CW_udt is completed, and may stop the decoding process based on the determination result. As a result, decoding speed may be improved and unnecessary power consumption may be prevented or reduced.

Although the first buffer 131 and the second buffer 133 are shown as separate elements in FIG. 2, exemplary embodiments are not limited thereto. For example, in an exemplary embodiment, the first buffer 131 and the second buffer 133 may be configured as one memory element.

Herein, when it is described that an error correction operation is performed on a codeword, it is to be understood that this process does not mean that an error is necessarily present in (and corrected in) the codeword. For example, performing an error correction operation on a codeword may refer to the process of determining whether an error is present in the codeword, and outputting an appropriate codeword based on whether an error is determined to be present in the codeword. For example, performing an error correction operation may include outputting the original codeword without modification (e.g., without correcting an error) when it is determined that no errors are present in the codeword, and outputting a corrected codeword (e.g., by correcting an error) when it is determined that an error is present in the codeword.

Figure 3:
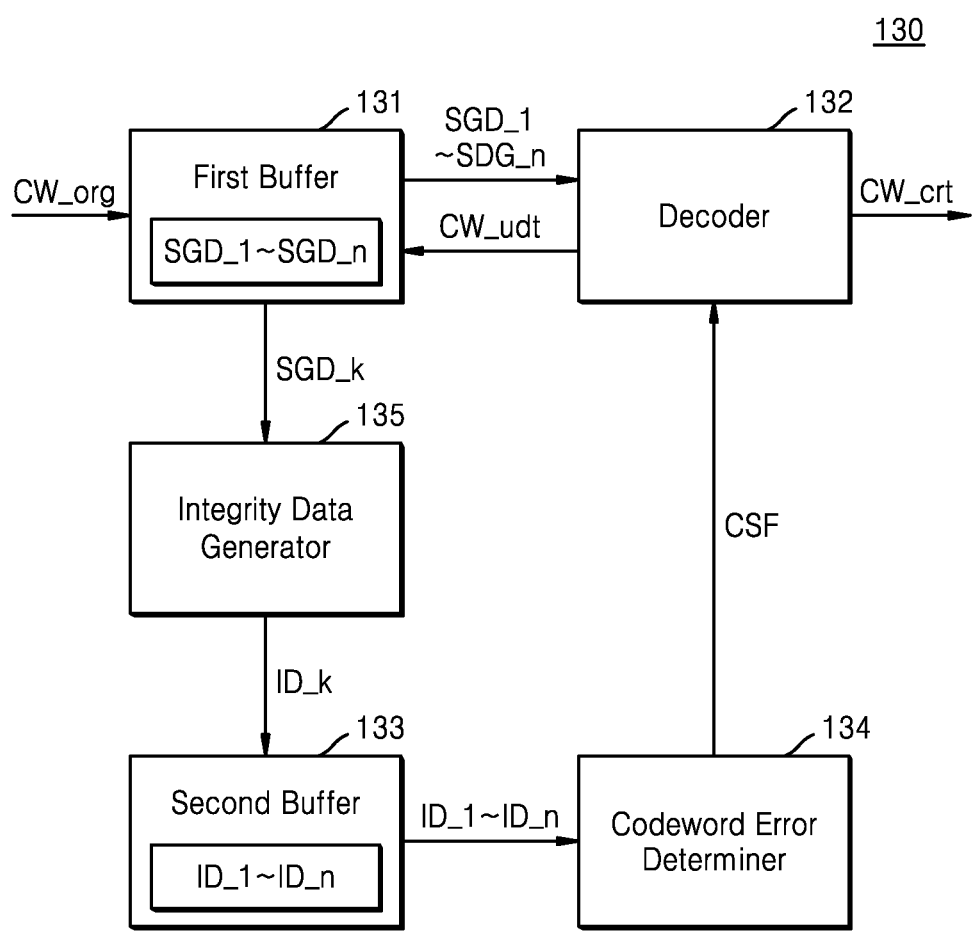
FIG. 3 is a block diagram illustrating an error correcting circuit according to an exemplary embodiment of the present inventive concept.

FIG. 3 is a block diagram illustrating the error correcting circuit 130 according to an exemplary embodiment of the present inventive concept. For convenience of explanation, a further description of components and technical aspects previously described with reference to FIG. 2 may be omitted.

Referring to FIG. 3, the error correcting circuit 130 may include the first buffer 131, the decoder 132, the second buffer 133, the codeword error determiner 134, and an integrity data generator 135. The first buffer 131, the decoder 132, the second buffer 133, and the codeword error determiner 134 are described above with reference to FIG. 2, and thus, a repeated description thereof will be omitted.

The integrity data generator 135 may receive the k-th subgroup data SGD_k from the first buffer 131, and may store the k-th integrity data ID_k corresponding to the k-th subgroup data SGD_k in the second buffer 133. Since the integrity data generator 135 generates the integrity data ID_1 to ID_n separately from the decoder 132, the codeword error determiner 134 may determine the existence of an error present in the codewords CW_org, CW_udt based on the integrity data ID_1 to ID_n without affecting the decoding capability of the decoder 132.

According to exemplary embodiments, the integrity data generator 135 and the codeword error determiner 134 may each be a processing device, which may be implemented using, for example, a processor, a controller and an arithmetic logic unit, a digital signal processor, a microcomputer, a field-programmable array, a programmable logic unit, a microprocessor, or any other device capable of running software or executing instructions.

Thus, referring to FIG. 3, in an exemplary embodiment, the codeword error determiner 134 may be referred to as a first processor, and the integrity data generator 135 may be referred to as a second processor.

Figure 4:
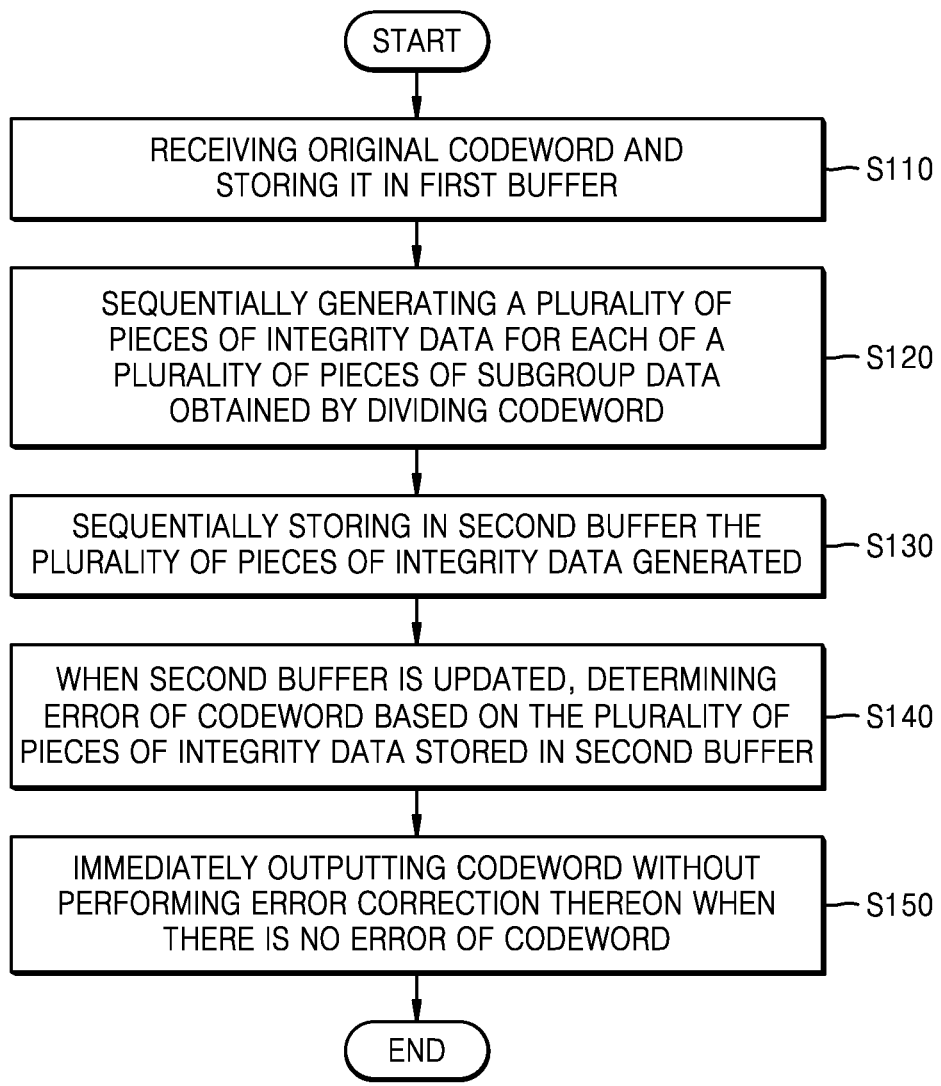
FIG. 4 is a flowchart illustrating an error correcting method according to an exemplary embodiment of the present inventive concept.

FIG. 4 is a flowchart illustrating an error correcting method according to an exemplary embodiment of the present inventive concept.

Referring to FIGS. 2 and 4, the error correcting circuit 130 may receive the original codeword CW_org and may store the original codeword CW_org in the first buffer 131 at operation S110. The error correcting circuit 130 may sequentially generate the plurality of pieces of integrity data ID_1 to ID_n for each of the plurality of pieces of subgroup data SGD_1 to SGD_n obtained by dividing the codewords CW_org, CW_udt stored in the first buffer 131 at operation S120. The error correcting circuit 130 may update the second buffer 133 by sequentially storing in the second buffer 133 the plurality of pieces of integrity data ID_1 to ID_n generated at operation S130.

When the second buffer 133 is updated, the error correcting circuit 130 may determine whether there is an error present in the codewords CW_org, CW_udt based on the plurality of pieces of integrity data ID_1 to ID_n stored in the second buffer 133 at operation S140. When there is no error present in the codewords CW_org, CW_udt, the error correcting circuit 130 may immediately output the codewords CW_org, CW_udt as the corrected codeword CW_crt without correcting an error at operation S150.

Figure 5:
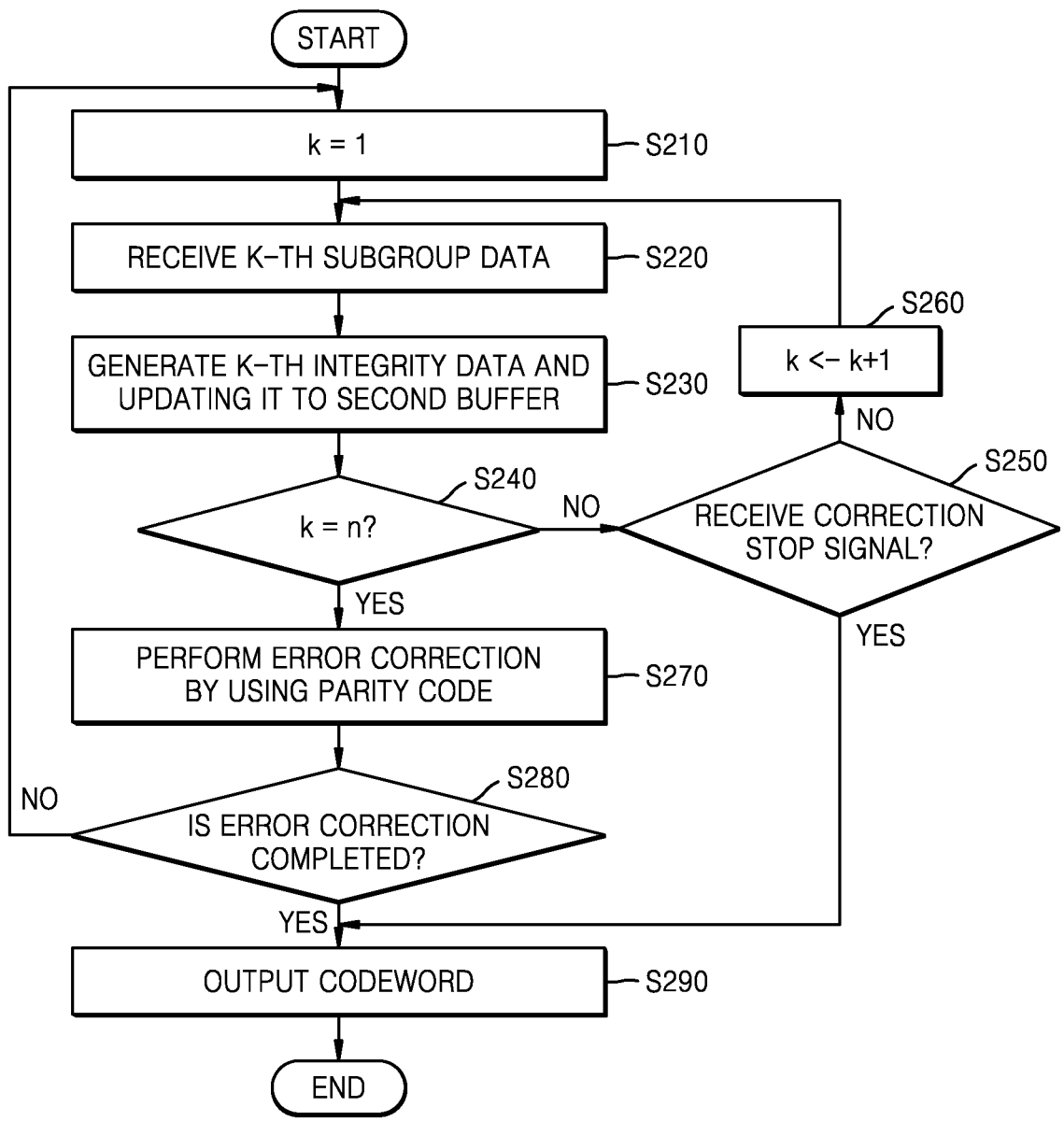
FIG. 5 is a flowchart illustrating an operation of a decoder according to an exemplary embodiment of the present inventive concept.

FIG. 5 is a flowchart illustrating an operation of the decoder 132 according to an exemplary embodiment of the present inventive concept.

Referring to FIGS. 2 and 5, an initial value of a flag k is set to 1 at operation S210, and the decoder 132 may receive the k-th subgroup data SGD_k from the first buffer 131 at operation S220. The decoder 132 may generate the k-th integrity data ID_k from the k-th subgroup data SGD_k, and may update the k-th integrity data ID_k generated in the second buffer 133 at operation S230. The decoder 132 may determine whether the flag k is equal to the number (n) of the plurality of pieces of subgroup data SGD_1 to SGD_n at operation S240.

When the flag k is not equal to the number (n) of the plurality of pieces of subgroup data SGD_1 to SGD_n, the decoder 132 may determine whether the correction stop signal CSF is received from the codeword error determiner 134 at operation S250. When the correction stop signal CSF is received, the decoder 132 may stop the decoding and may output the codeword CW_crt at operation S290. Otherwise, when the correction stop signal CSF is not received, the flag k is incremented by 1 at operation S260, and operations S220 to S240 may be repeated.

Referring again to operation S240, when the flag k is equal to the number (n) of the plurality of pieces of subgroup data SGD_1 to SGD_n, the decoder 132 may correct an error present in the user data by using the parity code included in the codewords CW_org, CW_udt at operation S270. The decoder 132 may determine whether the error correction operation performed on the codewords CW_org, CW_udt is completed at operation S280. When the error correction is completed, the codeword CW_crt may be output at operation S290. Otherwise, when the error correction is not completed, the decoder 132 may repeat operations S210 to S270.

Although an exemplary embodiment in which the decoder 132 generates the integrity data ID_1 to ID_n is shown in FIG. 5, exemplary embodiments of the present inventive concept are not limited thereto. For example, the method described with reference to FIG. 5 may be applied to an exemplary embodiment in which the integrity data generator 135, which is a separate element, generates the integrity data ID_1 to ID_n, as shown in FIG. 3.

Figure 6A:
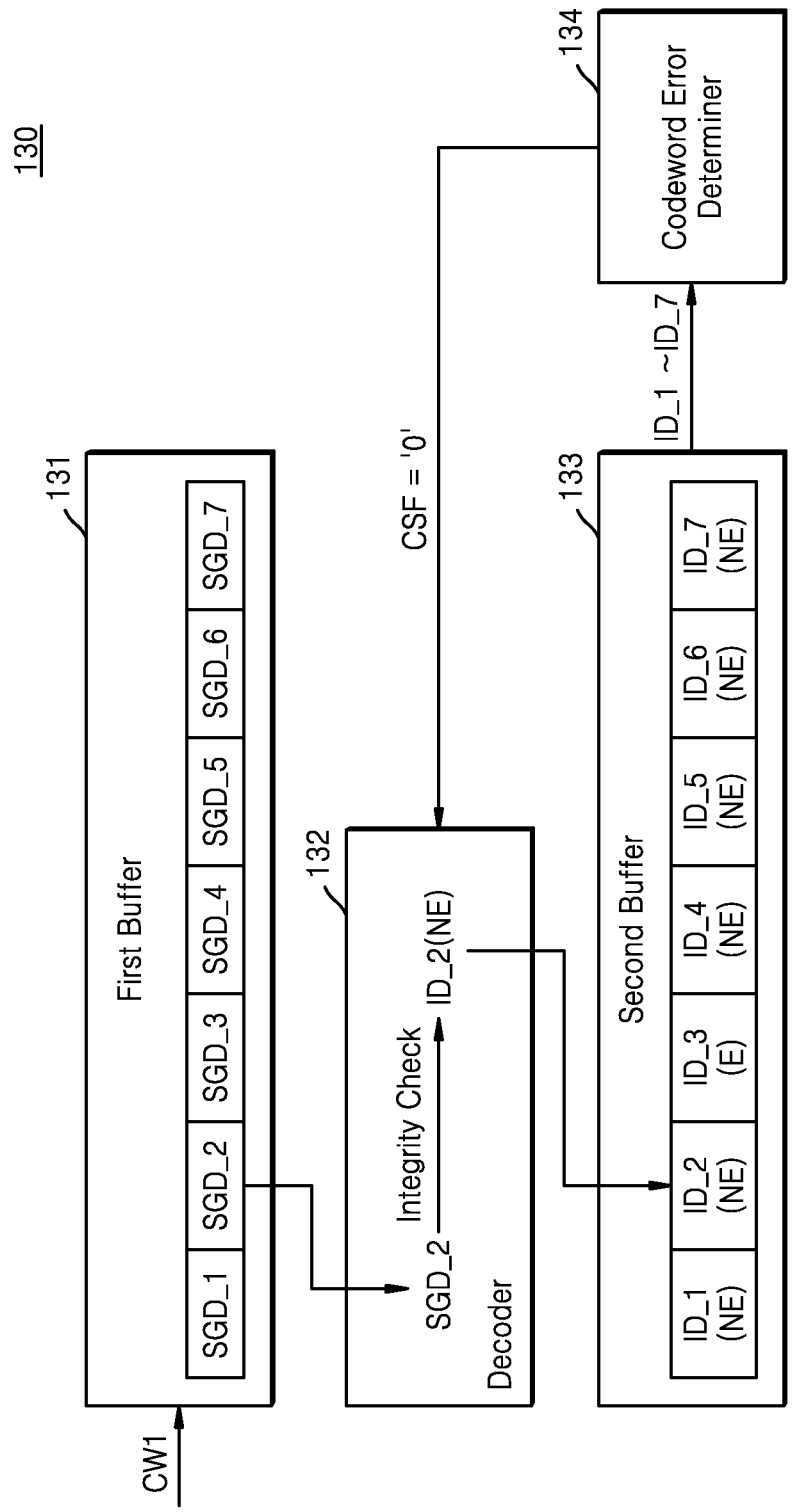
FIGS. 6A and 6B are diagrams illustrating an operation of an error correcting circuit according to an exemplary embodiment of the present inventive concept.
Figure 6B:
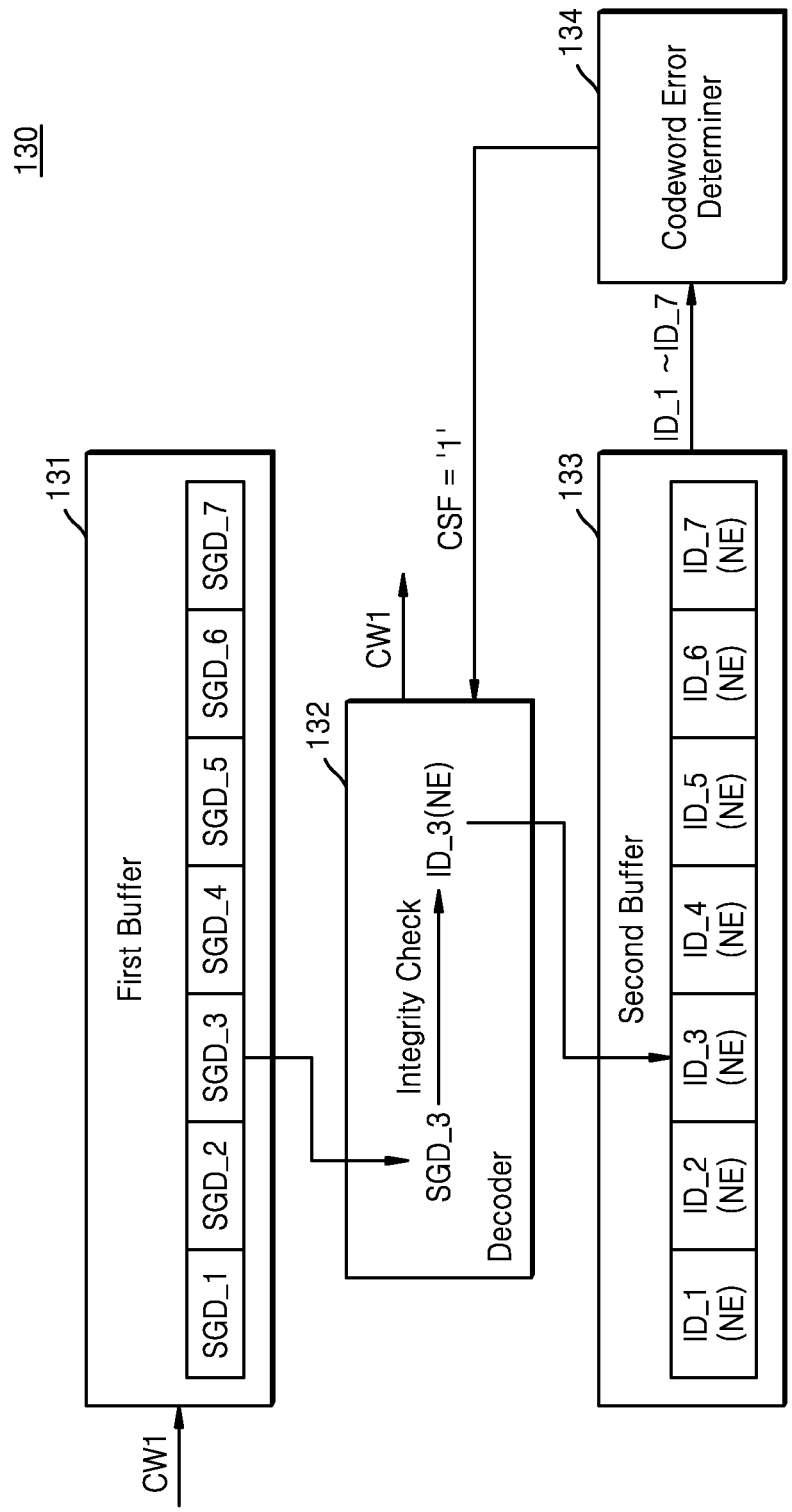

FIGS. 6A and 6B are diagrams illustrating an operation of the error correcting circuit 130 according to an exemplary embodiment of the present inventive concept. For example, FIGS. 6A and 6B are diagrams illustrating a decoding process for the second subgroup data SGD_2 and the third subgroup data SGD_3 included in the updated codeword CW_udt after storing, in the second buffer 133, the first integrity data ID_1 to the seventh integrity data ID_7 corresponding to each of the first subgroup data SGD_1 to the seventh subgroup data SGD_7 due to the completion of the decoding for the original codeword CW_org. FIG. 6B represents operations performed after those of FIG. 6A in time order.

Referring to FIGS. 2 and 6A, the decoder 132 may receive from the first buffer 131 the second subgroup data SGD_2 included in first codeword CW1, and may perform an integrity check on the second subgroup data SGD_2. In exemplary embodiments, the integrity check refers to confirming operations that check whether there is an error present in the subgroup data during the decoding process. In exemplary embodiments, a partial syndrome method or a partial cyclic redundancy check may be used for the integrity check. However, exemplary embodiments of the present inventive concept are not limited thereto. Methods used to perform the integrity check will be described in detail with reference to FIGS. 7 to 12.

The decoder 132 may generate the second integrity data ID_2 from the second subgroup data SGD_2 by the integrity check. In the example of FIG. 6A, the second integrity data ID_2 may include information indicating that the second subgroup data SGD_2 includes no errors (NE). The decoder 132 may update the second integrity data ID_2 in the second buffer 133, and the codeword error determiner 134 may determine whether there is an error present in the first codeword CW1 based on the first integrity data ID_1 to the seventh integrity data ID_7. Due to the third integrity data ID_3 including information indicating that there is an error (E) for the third subgroup data SGD_3, the codeword error determiner 134 may determine that an error exists in the first codeword CW1 by combining the first integrity data ID_1 to the seventh integrity data ID_7. Accordingly, the codeword error determiner 134 may output 0 as the correction stop signal CSF to the decoder 132, and the decoder 132 may continue the decoding process for the first codeword CW1.

Referring to FIGS. 2 and 6B, the decoder 132 may receive from the first buffer 131 the third subgroup data SGD_3 included in the first codeword CW1 and may perform the integrity check on the third subgroup data SGD_3. The decoder 132 may generate the third integrity data ID_3 from the third subgroup data SGD_3 by the integrity check. In the example of FIG. 6B, the third integrity data ID_3 may include information indicating that the third subgroup data SGD_3 includes no errors (NE). The decoder 132 may update the third integrity data ID_3 in the second buffer 133 to indicate no errors (NE), and the codeword error determiner 134 may determine whether there is an error present in the first codeword CW1 based on the first integrity data ID_1 to the seventh integrity data ID_7.

As the third integrity data ID_3 is updated, information indicating that there is no error present in all of the first integrity data ID_1 to the seventh integrity data ID_7 may be included in the second buffer 133, and the codeword error determiner 134 may determine that no error exists in the first codeword CW1 by combining the first integrity data ID_1 to the seventh integrity data ID_7. Accordingly, the codeword error determiner 134 may output 1 as the correction stop signal CSF to the decoder 132, and the decoder 132 may output the first codeword CW1 to the outside (e.g., to the host of FIG. 1) without performing the decoding process for the fourth subgroup data SGD_4 to the seventh subgroup data SGD_7 in response to receiving 1 as the correction stop signal CSF.

Thus, as shown in FIGS. 6A and 6B, according to an exemplary embodiment of the present inventive concept, the decoding process for at least a part of the plurality of pieces of subgroup data (e.g., SGD_4 to SGD_7) may be skipped. As a result, performance of the decoding process may be improved and power consumption may be reduced.

Although an exemplary embodiment in which the decoder 132 generates the integrity data (e.g., ID_1 to ID_7) is illustrated in FIGS. 6A and 6B, exemplary embodiments of the present inventive concept are not limited thereto. For example, the operation described with reference to FIGS. 6A and 6B may be applied to an exemplary embodiment in which the integrity data generator 135, which is a separate element, generates the integrity data (e.g., ID_1 to ID_7), as shown in FIG. 3.

Figure 7:
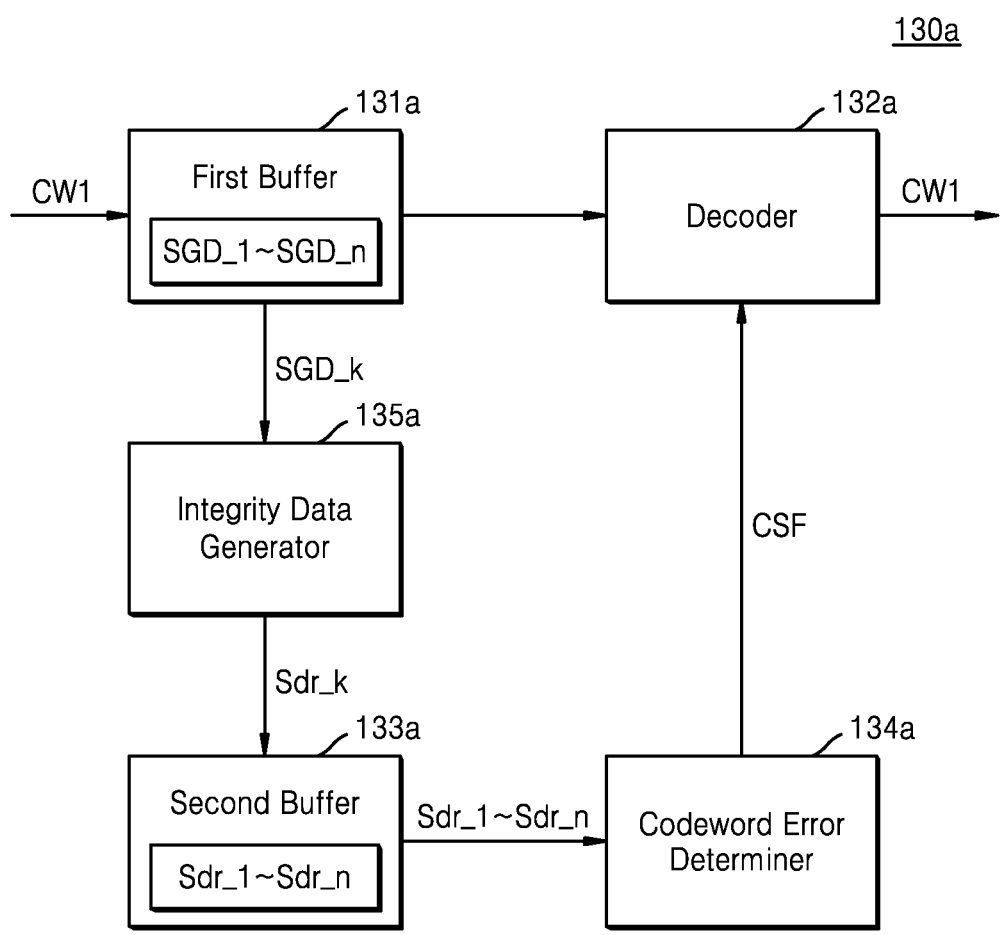
FIG. 7 is a block diagram illustrating an error correcting circuit according to an exemplary embodiment of the present inventive concept.

FIG. 7 is a block diagram illustrating an error correcting circuit 130a according to an exemplary embodiment of the present inventive concept. For convenience of explanation, a further description of components and technical aspects previously described with reference to FIG. 3 may be omitted.

Referring to FIG. 7, the error correcting circuit 130a may include a first buffer 131a, a decoder 132a, a second buffer 133a, a codeword error determiner 134a, and an integrity data generator 135a. The integrity data generator 135a may generate k-th syndrome data Sdr_k based on the k-th subgroup data SGD_k. The k-th syndrome data Sdr_k may be data representing whether the k-th subgroup data SGD_k satisfies a certain conditional expression. For example, the certain conditional expression may indicate whether a Tanner graph (hereinafter referred as an LDPC graph) according to an LDPC is satisfied.

The integrity data generator 135a may update first syndrome data Sdr_1 to n-th syndrome data Sdr_n in the second buffer 133a with the k-th syndrome data Sdr_k, and the codeword error determiner 134a may determine whether the first codeword CW1 satisfies the certain conditional expression based on the first syndrome data Sdr_1 to the n-th syndrome data Sdr_n. When the first codeword CW1 satisfies the certain conditional expression, the codeword error determiner 134a may output to the decoder 132a the correction stop signal CSF, and the decoder 132a may stop the decoding process and may output the first codeword CW1 to the outside (e.g., to the host of FIG. 1).

Although an exemplary embodiment in which the integrity data generator 135a generates the k-th syndrome data Sdr_k is illustrated in FIG. 7, exemplary embodiments of the present inventive concept are not limited thereto. For example, the process described with reference to FIG. 7 may be applied to an exemplary embodiment in which the decoder 132a generates the k-th syndrome data Sdr_k.

Figure 8:
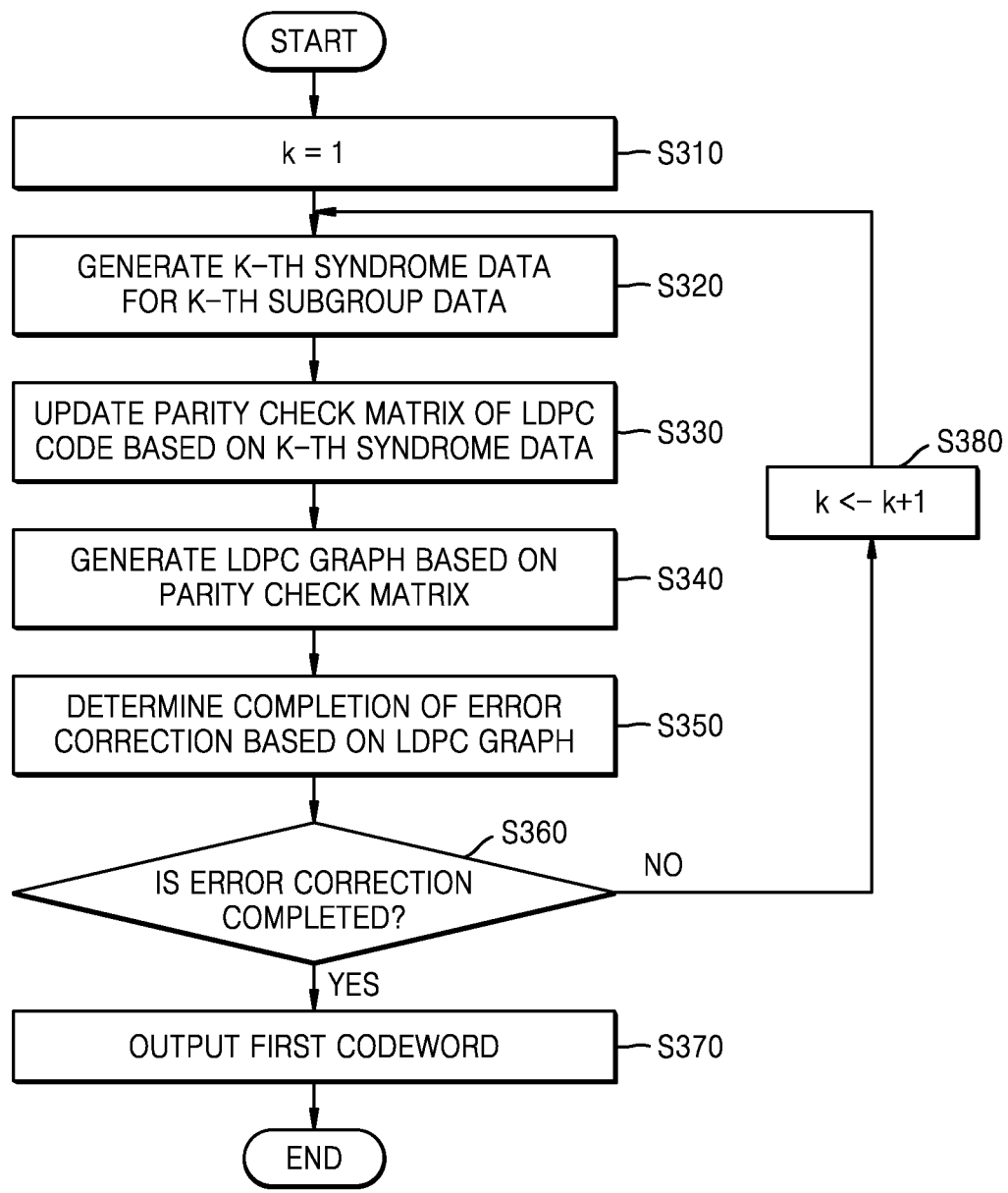
FIG. 8 is a flowchart illustrating an error correcting method according to an exemplary embodiment of the present inventive concept.

FIG. 8 is a flowchart illustrating an error correcting method according to an exemplary embodiment of the present inventive concept.

Referring to FIGS. 7 and 8, the error correcting circuit 130a sets an initial value of a flag k to 1 at operation S310, and may generate the k-th syndrome data Sdr_k for the k-th subgroup data SGD_k included in the first codeword CW1 at operation S320. The error correcting circuit 130a may update a parity check matrix of an LDPC code stored in the second buffer 133a based on the k-th syndrome data Sdr_k at operation S330. The error correcting circuit 130a may generate an LDPC graph based on the parity check matrix at operation S340. At operation S350, the error correcting circuit 130a may determine whether an error correction is completed based on the generated LDPC graph. When the error correction is determined to not be completed at operation S360, the flag k is incremented by 1 at operation S380, and operations S320 to S360 may be repeated. Alternatively, when the error correction is determined to be completed at operation S360, the first codeword CW1 may be output to the outside (e.g., to the host of FIG. 1) at operation S370.

Figure 9A:
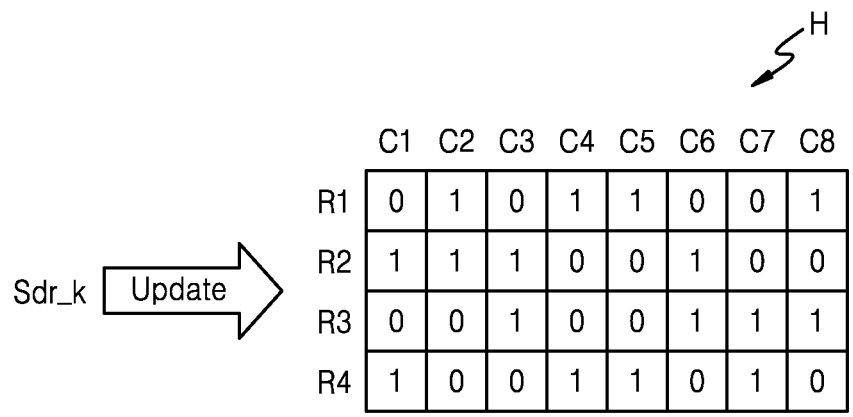
FIGS. 9A and 9B are diagrams showing a method of determining completion of an error correction according to an exemplary embodiment of the present inventive concept.
Figure 9B:
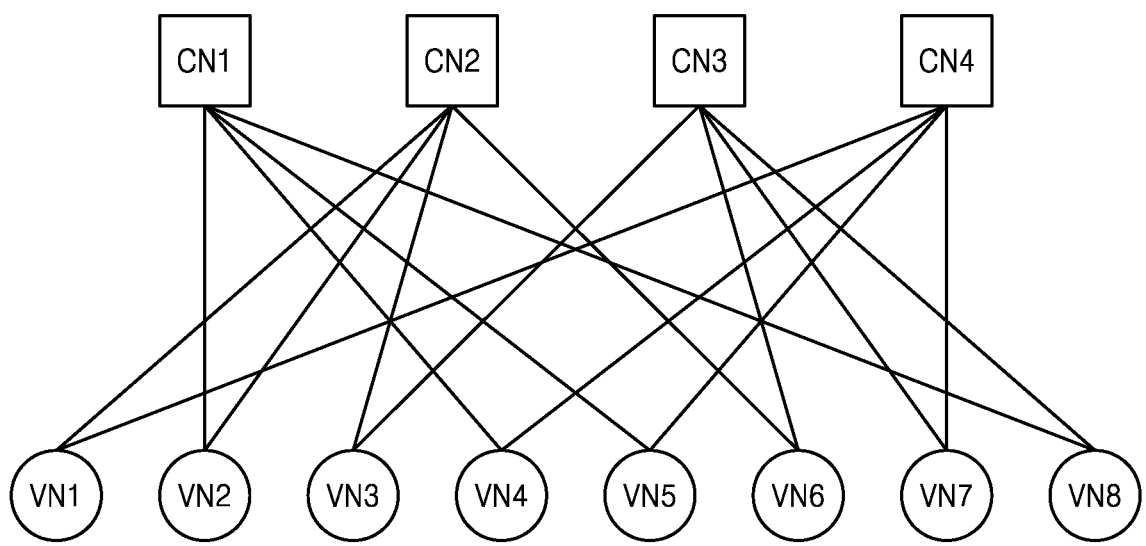

FIGS. 9A and 9B are diagrams showing a method of determining completion of an error correction according to an exemplary embodiment of the present inventive concept.

Referring to FIGS. 7, 9A, and 9B, variable nodes and check nodes for the first codeword CW1 may be constructed based on the parity check matrix H of the LDPC code. The parity check matrix H may include first to fourth rows R1 to R4 and first to eighth columns C1 to C8. The number of check nodes of the first codeword CW1 may be equal to the number of rows of the parity check matrix H. For example, first to fourth check nodes CN1 to CN4 respectively corresponding to the first to fourth rows R1 to R4 of the parity check matrix H may be computed by the integrity data generator 135a and may be updated by the k-th syndrome data Sdr_k. The number of variable nodes of the first codeword CW1 may be equal to the number of columns of the parity check matrix H. For example, first to eighth variable nodes VN1 to VN8 respectively corresponding to the first to eighth columns C1 to C8 of the parity check matrix H may be computed by the integrity data generator 135a and may be updated by the k-th syndrome data Sdr_k.

Each element of the parity check matrix H may be represented as h(i, j). The variable i may refer to a row of the parity check matrix H, and the variable j may refer to a column of the parity check matrix H. In an exemplary embodiment, when the value of each element h(i, j) of the parity check matrix H is 1, the i-th check node and the j-th variable node are associated with each other, and when the value of each element h(i, j) of the parity check matrix H is 0, the i-th check node and the j-th variable node are not associated with each other. FIG. 9B shows the variable nodes VN1 to VN8 and the check nodes CN1 to CN4 based on the parity check matrix H.

Since the value of the second row R2 and the value of the fourth row R4 is 1 at the first column C1 corresponding to the first variable node VN1, the first variable node VN1 is associated with the second check node CN2 and the fourth check node CN4. Since the value of the first row R1 and the value of the second row R2 is 1 at the second column C2, which corresponds to the second variable node VN2, the second variable node VN2 is associated with the first check node CN1 and the second check node CN2. Since the value of the second row R2 and the value of the third row R3 is 1 at the third column C3, which corresponds to the third variable node VN3, the third variable node VN3 is associated with the second check node CN2 and the third check node CN3. Since the value of the first row R1 and the value of the fourth row R4 is 1 at the fourth column C4, which corresponds to the fourth variable node VN4, the fourth variable node VN4 is associated with the first check node CN1 and the fourth check node CN4.

Since the value of the first row R1 and the value of the fourth row R4 is 1 at the fifth column C5, which corresponds to the fifth variable node VN5, the fifth variable node VN5 is associated with the first check node CN1 and the fourth check node CN4. Since the value of the second row R2 and the value of the third row R3 is 1 at the sixth column C6, which corresponds to the sixth variable node VN6, the sixth variable node VN6 is associated with the second check node CN2 and the third check node CN3. Since the value of the third row R3 and the value of the fourth row R4 is 1 at the seventh column C7, which corresponds to the seventh variable node VN7, the seventh variable node VN7 is associated with the third check node CN3 and the fourth check node CN4. Since the value of the first row R1 and the value of the third row R3 is 1 at the eighth column C8, which corresponds to the eighth variable node VN8, the eighth variable node VN8 is associated with the first check node CN1 and the third check node CN3.

The codeword error determiner 134a may determine the completion of the error correction of the first codeword CW1 based on the generated LDPC graph. When correction of the first codeword CW1 is completed, the codeword error determiner 134a may output to the decoder 132a the correction stop signal CSF, and the decoder 132a may output the first codeword CW1 to the outside (e.g., to the host of FIG. 1) in response to the correction stop signal CSF.

Figure 10:
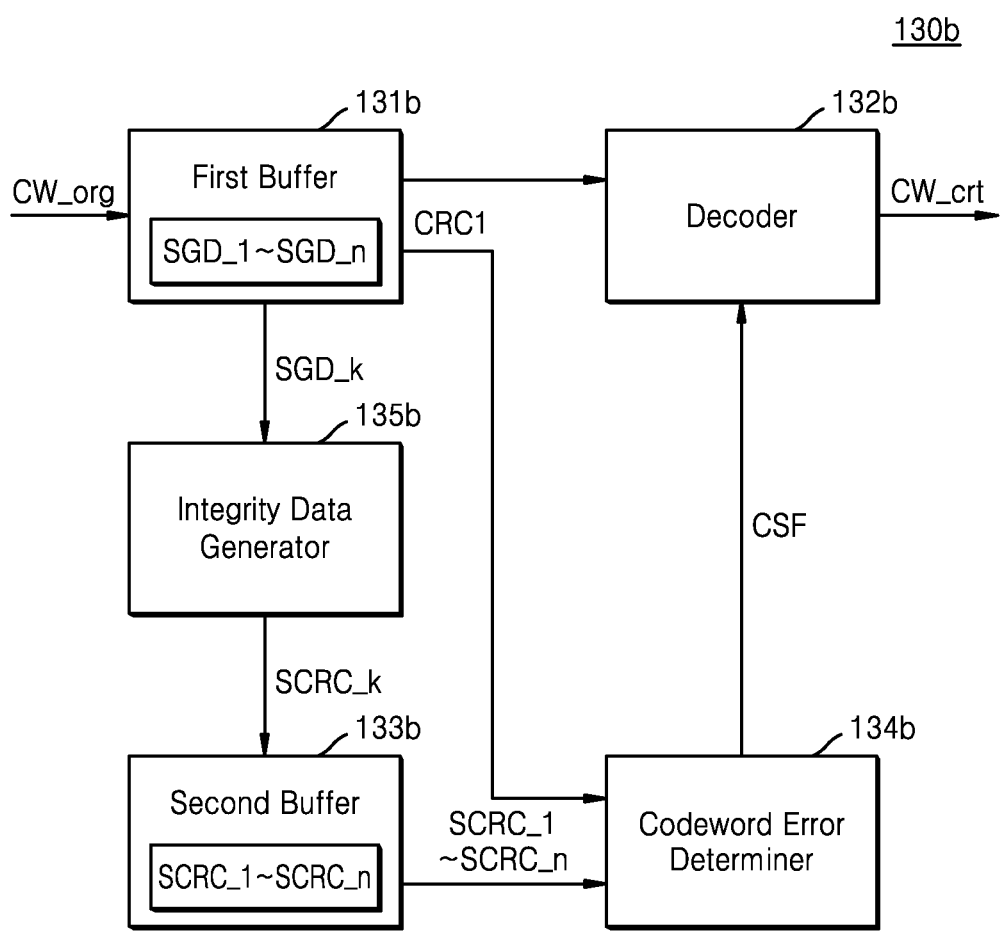
FIG. 10 is a block diagram illustrating an error correcting circuit according to an exemplary embodiment of the present inventive concept.

FIG. 10 is a block diagram illustrating an error correcting circuit 130b according to an exemplary embodiment of the present inventive concept. For convenience of explanation, a further description of components and technical aspects previously described with reference to FIG. 3 may be omitted.

Referring to FIG. 10, the error correcting circuit 130b may include a first buffer 131b, a decoder 132b, a second buffer 133b, a codeword error determiner 134b, and an integrity data generator 135b. The integrity data generator 135b may generate k-th sub-CRC data SCRC_k by performing CRC operations based on the k-th subgroup data SGD_k. The integrity data generator 135b may store the k-th sub-CRC data SCRC_k in the second buffer 133b.

In exemplary embodiments, the CRC operations may be an error-detecting method used to verify the reliability of data in data transmission and reception systems. For example, the CRC operations may refer to operations that divide the subgroup data by a certain polynomial and generate sub-CRC data by remainders. That is, the k-th sub-CRC data SCRC_k may correspond to a remainder (e.g., a result of a mod function) derived from dividing the k-th subgroup data SGD_k with the certain polynomial.

The first codeword CW1 may include user data containing first CRC data CRC1, and the codeword error determiner 134b may receive from the first buffer 131b the first CRC data CRC1 included in the first codeword CW1. Moreover, the codeword error determiner 134b may generate second CRC data CRC2 based on first sub-CRC data SCRC_1 to n-th sub-CRC data SCRC_n received from the second buffer 133b. In an example, the codeword error determiner 134b may generate the second CRC data CRC2 with a remainder derived from dividing a result obtained by performing an add operation or a multiplication operation on the first sub-CRC data SCRC_1 to the n-th sub-CRC data SCRC_n by the certain polynomial.

The codeword error determiner 134b may compare the generated second CRC data CRC2 with the first CRC data CRC1 received from the first buffer 131b. As a result of the comparison, when the first CRC data CRC1 is identical to the second CRC data CRC2, the codeword error determiner 134b may output the correction stop signal CSF to the decoder 132b, and the decoder 132b may stop the decoding process and may output the first codeword CW1 to the outside (e.g., to the host of FIG. 1).

Although an exemplary embodiment in which the integrity data generator 135b produces the k-th sub-CRC data SCRC_k is illustrated in FIG. 10, exemplary embodiments of the present inventive concept are not limited thereto. For example, the operation described with reference to FIG. 10 may be applied to an exemplary embodiment in which the decoder 132b generates the k-th sub-CRC data SCRC_k.

Figure 11:
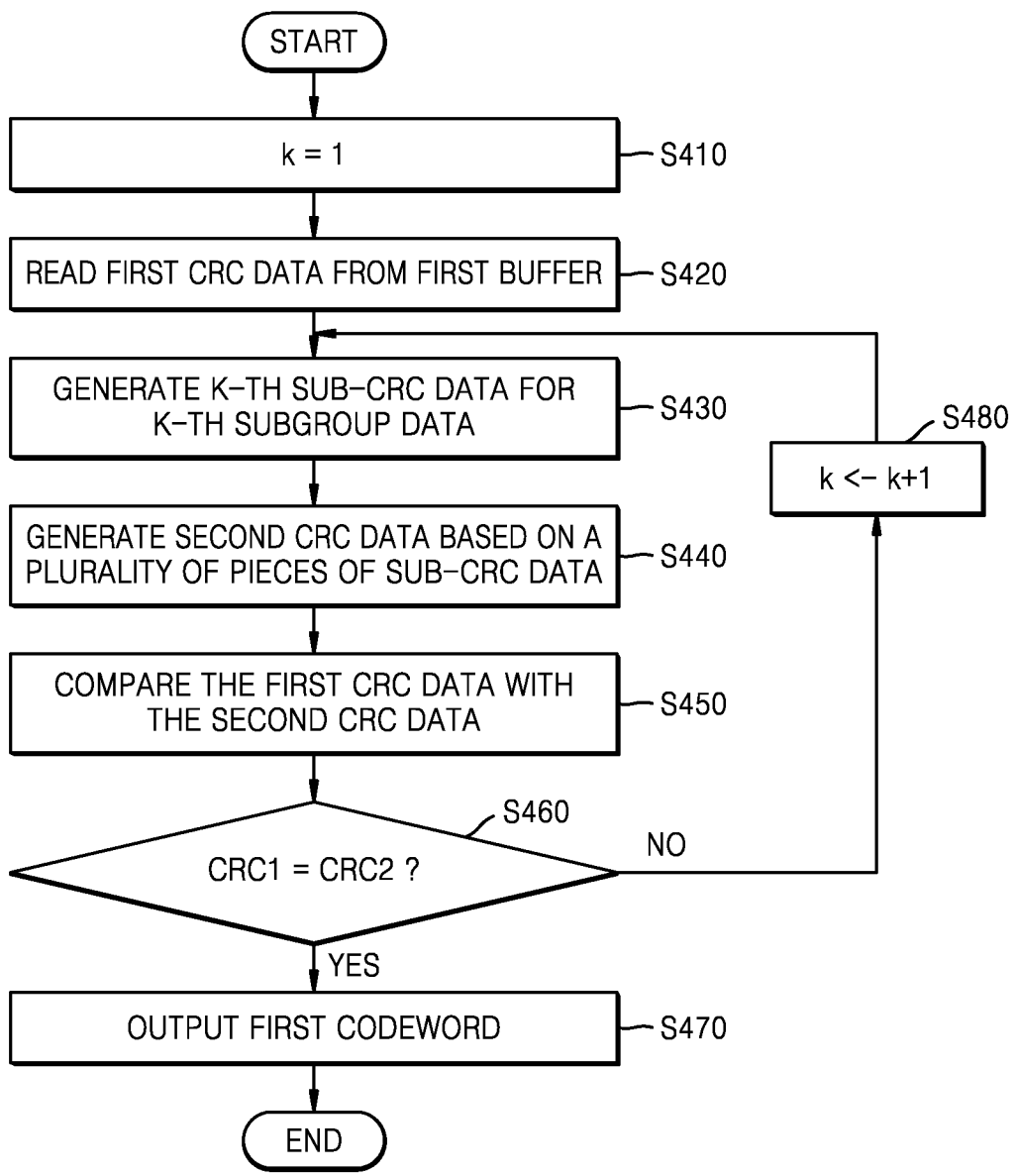
FIG. 11 is a flowchart illustrating an error correcting method according to an exemplary embodiment of the present inventive concept.

FIG. 11 is a flowchart illustrating an error correcting method according to an exemplary embodiment of the present inventive concept.

Referring to FIGS. 10 and 11, the error correcting circuit 130b sets an initial value of a flag k to 1 at operation S410, and may read the first CRC data CRC1 from the first buffer 131b at operation S420. The error correcting circuit 130b may generate the k-th sub-CRC data SCRC_k for the k-th subgroup data SGD_k included in the first codeword CW1 at operation S430. The error correcting circuit 130b may generate the second CRC data CRC2 based on a plurality of pieces of sub-CRC data SCRC_1 to SCRC_n at operation S440.

The error correcting circuit 130b may compare the generated second CRC data CRC2 with the first CRC data CRC1 received from the first buffer 131b at operation S450. When it is determined that the first CRC data CRC1 is not identical to the second CRC data CRC2 at operation S460, the flag k is incremented by 1 at operation S480, and operations S430 to S460 are repeated. Alternatively, when it is determined that the first CRC data CRC1 is identical to the second CRC data CRC2 at operation S460, the first codeword CW1 may be output to the outside (e.g., to the host of FIG. 1) at operation S470.

Figure 12:
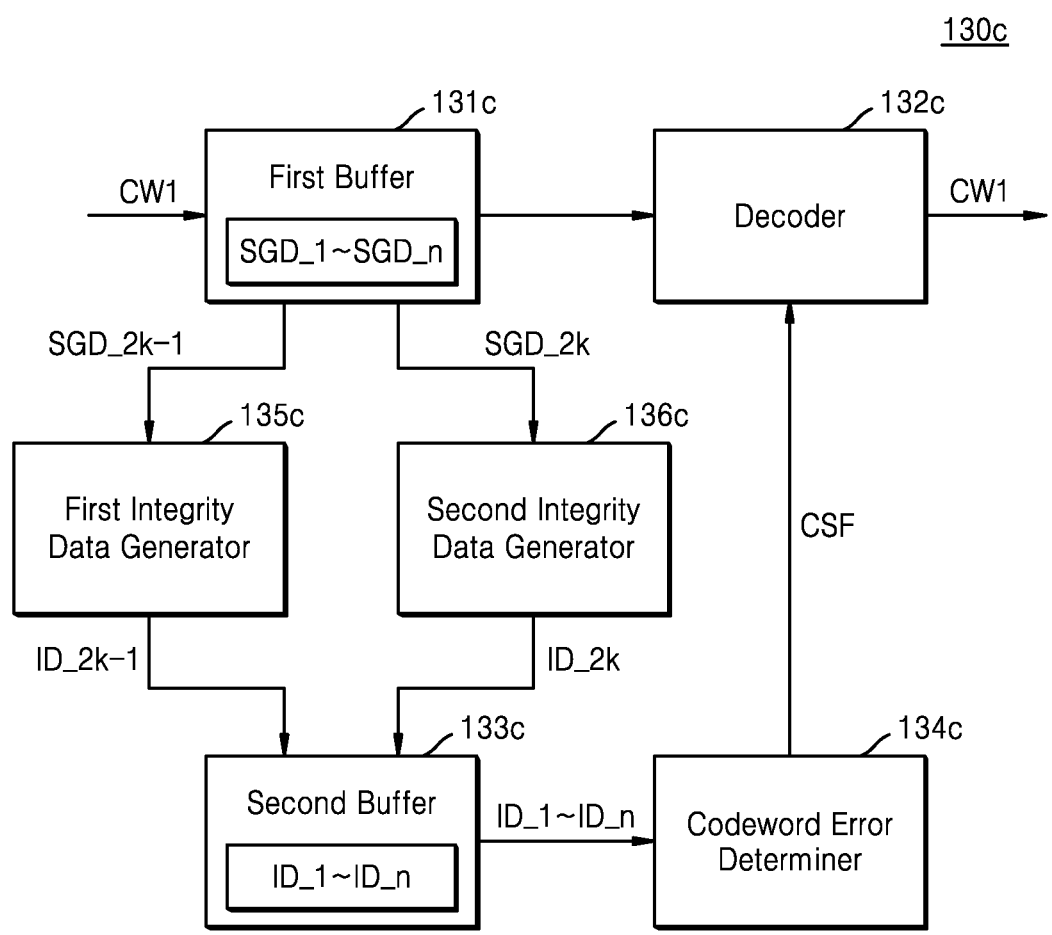
FIG. 12 is a block diagram illustrating an error correcting circuit according to an exemplary embodiment of the present inventive concept.

FIG. 12 is a block diagram illustrating an error correcting circuit 130c according to an exemplary embodiment of the present inventive concept. For convenience of explanation, a further description of components and technical aspects previously described with reference to FIG. 3 may be omitted.

Referring to FIG. 12, the error correcting circuit 130c may include a first buffer 131c, a decoder 132c, a second buffer 133c, a codeword error determiner 134c, a first integrity data generator 135c, and a second integrity data generator 136c. The first buffer 131c, the decoder 132c, the second buffer 133c, and the codeword error determiner 134c may be respectively identical to or may be respectively similar to the first buffer 131, the decoder 132, the second buffer 133 and the codeword error determiner 134 of FIG. 1, and thus, a further description thereof will be omitted.

The first integrity data generator 135c may receive odd-numbered subgroup data SGD_2k−1 and may generate odd-numbered integrity data ID_2k−1. Moreover, the second integrity data generator 136c may receive even-numbered subgroup data SGD_2k and may generate even-numbered integrity data ID_2k. The odd-numbered integrity data ID_2k−1 generated by the first integrity data generator 135c and the even-numbered integrity data ID_2k generated by the second integrity data generator 136c may be sequentially stored in the second buffer 133c as the plurality of pieces of integrity data ID_1 to ID_n. The first integrity data generator 135c may generate the odd-numbered integrity data with the syndrome data described with reference to FIG. 7 or the sub-CRC data described with reference to FIG. 10, and the second integrity data generator 136c may generate the even-numbered integrity data with the syndrome data described with reference to FIG. 7 or the sub-CRC data described with reference to FIG. 10.

According to an exemplary embodiment of the present inventive concept, the error correcting circuit 130c may rapidly generate the plurality of pieces of integrity data ID_1 to ID_n, which correspond to the plurality of pieces of subgroup data SGD_1 to SGD_n, by including multiple integrity data generators 135c and 136c. As a result, the speed of making a determination of the existence of an error by the codeword error determiner 134c may be improved. Accordingly, the decoding process for the first codeword CW1 may be completed more rapidly.

Although an exemplary embodiment which includes two integrity data generators is illustrated in FIG. 12, exemplary embodiments of the present inventive concept are not limited thereto. For example, according to exemplary embodiments, three or more integrity data generators may be included in the error correcting circuit 130c. In addition, in an exemplary embodiment, the decoder 132c may serve as the first integrity data generator 135c or the second integrity data generator 136c.

Figure 13:
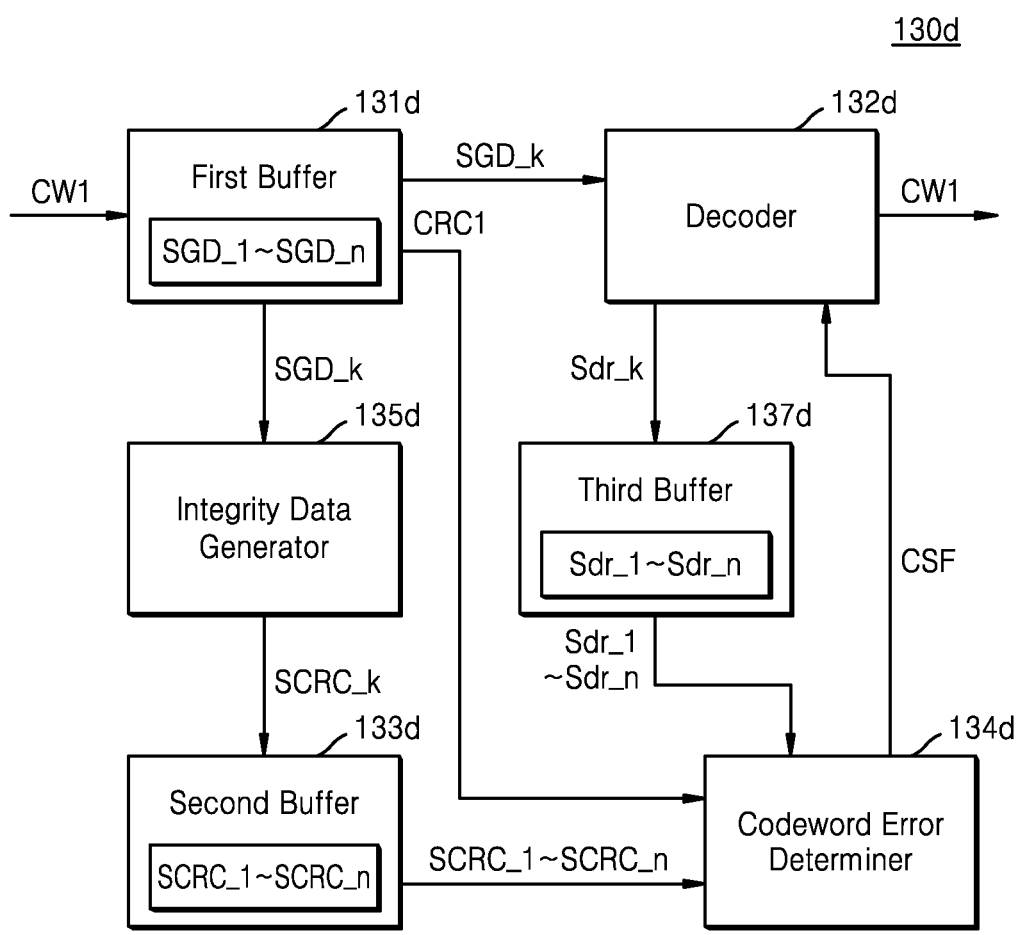
FIG. 13 is a block diagram illustrating an error correcting circuit according to an exemplary embodiment of the present inventive concept.

FIG. 13 is a block diagram illustrating an error correcting circuit 130d according to an exemplary embodiment of the present inventive concept. For convenience of explanation, a further description of components and technical aspects previously described with reference to FIG. 10 may be omitted.

Referring to FIG. 13, the error correcting circuit 130d may include a first buffer 131d, a decoder 132d, a second buffer 133d, a codeword error determiner 134d, an integrity data generator 135d, and a third buffer 137d. The first buffer 131d, the second buffer 133d, and the codeword error determiner 134d may be respectively identical to or may be respectively similar to the first buffer 131b, the second buffer 133b, and the codeword error determiner 134b of FIG. 10, and thus, a further description thereof will be omitted.

The decoder 132d may receive the k-th subgroup data SGD_k and may generate the k-th syndrome data Sdr_k.

Moreover, the decoder 132d may store in the third buffer 137d the generated k-th syndrome data Sdr_k. The third buffer 137d may include a memory element capable of storing data. In addition, as an example, the third buffer 137d may be configured as a volatile memory device such as SRAM, DRAM, a latch, a flip-flop, or a register.

The codeword error determiner 134d may perform a primary integrity check based on the first CRC data CRC1 received from the first buffer 131d and the second CRC data CRC2 generated from the plurality of pieces of sub-CRC data SCRC_1 to SCRC_n received from the second buffer 133d. In addition, the codeword error determiner 134d may perform a secondary integrity check based on the plurality of pieces of syndrome data Sdr_1 to Sdr_n received from the third buffer 137d. The codeword error determiner 134d may output to the decoder 132d the correction stop signal CSF based on the primary integrity check and the secondary integrity check.

In an exemplary embodiment, the codeword error determiner 134d may output to the decoder 132d the correction stop signal CSF when both a result of the primary integrity check and a result of the secondary integrity check indicate that there is no error present in the first codeword CW1. In an exemplary embodiment, the codeword error determiner 134d may output to the decoder 132d the correction stop signal CSF when at least one of the result of the primary integrity check and the result of the secondary integrity check indicate that there is no error present in the first codeword CW1.

The error correcting circuit 130d according to an exemplary embodiment of the present inventive concept may increase the probability of error corrections and data reliability by stopping the decoding process based on different integrity check methods.

The control operations described herein may be implemented in various ways depending on applications. For example, the control operations may be implemented in hardware, firmware, software, or combinations thereof. When the control operations are implemented in hardware, processing units may be embodied by ASICs (application specific integrated circuit), DSPs (digital signal processor), DSPDs (digital signal processor device), PLDs (programmable logic device), FPGAs (field programmable gate array), processors, controllers, micro-controllers, microprocessors, electronic devices, other electronic units designed to perform functions described in the specification of the inventive concept, or combinations thereof.

Figure 14:
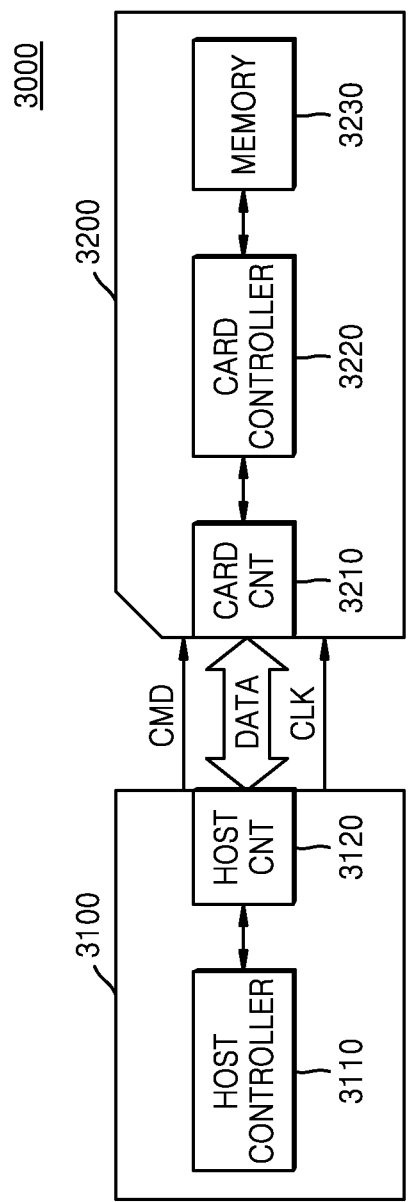
FIG. 14 is a block diagram illustrating a memory card system including a memory system according to an exemplary embodiment of the present inventive concept.

FIG. 14 is a block diagram illustrating a memory card system 3000 including the memory system 1000 according to an exemplary embodiment of the present inventive concept.

Referring to FIG. 14, the memory card system 3000 may include a host 3100 and a memory card 3200. The host 3100 may include a host controller 3110 and a host connection unit 3120. The memory card 3200 may include a card connection unit 3210, a card controller 3220 and a memory device 3230.

The memory controller 100 and the memory device 200 respectively shown in FIGS. 1 to 13 may be applied to the card controller 3220 and the memory device 3230 shown in FIG. 14. In response to commands received via the card connection unit 3210, the card controller 3220 may decode data read from the memory device 3230 by applying a decoding method disclosed above according to exemplary embodiments of the present inventive concept. For example, the card controller 3220 may improve the performance of the decoding process and may reduce the power consumption by stopping the decoding process based on a determination result of determining whether there is an error present in the subgroup data during the decoding process of the codeword.

The host 3100 may write data to the memory card 3200 or may read data stored in the memory card 3200. The host controller 3110 may transmit to the memory card 3200, via the host connection unit 3120, a command CMD, a clock signal CLK generated by a clock generator in the host 3100, and data.

The memory card 3200 may be implemented as, for example, a compact flash card (CFC), a microdrive, a smart media card (SMC), a multimedia card (MMC), a security digital card (SDC), a memory stick, a USB flash memory drive, etc.

As is traditional in the field of the present inventive concept, exemplary embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies.

In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the exemplary embodiments may be physically separated into two or more interacting and discrete blocks, units and/or modules without departing from the scope of the present inventive concept. Further, the blocks, units and/or modules of the exemplary embodiments may be physically combined into more complex blocks, units and/or modules without departing from the scope of the present inventive concept.

While the present inventive concept has been particularly shown and described with reference to the exemplary embodiments thereof, it will be understood that various changes in form and detail may be made therein without departing from the spirit and scope of the present inventive concept as defined by the following claims.

What is claimed is:

1. An error correcting circuit, comprising:
  a first buffer configured to store a codeword and sequentially output a plurality of pieces of subgroup data obtained by dividing the codeword,
    wherein the codeword includes user data and a parity code, and the error correcting circuit is configured to receive the codeword and perform an error correction operation on the user data;
  a decoder configured to generate a plurality of pieces of integrity data for each of the plurality of pieces of subgroup data received from the first buffer and perform the error correction operation on the user data using the parity code;
  a second buffer configured to sequentially store the plurality of pieces of integrity data for each of the plurality of pieces of subgroup data; and a first processor configured to determine whether an error is present in the codeword based on the plurality of pieces of integrity data stored in the second buffer when at least one of the plurality of pieces of integrity data is updated in the second buffer.

2. The error correcting circuit of claim 1, wherein
the decoder is further configured to store the codeword in the first buffer when it is determined that an error is present in the codeword, and
output the codeword when it is determined that no error is present in the codeword.

3. The error correcting circuit of claim 1, wherein
the first processor is further configured to output a correction stop signal to the decoder when there is no error present in the codeword, and
the decoder is further configured to output the codeword without performing an error determination for the codeword in response to the correction stop signal.

4. The error correcting circuit of claim 1, further comprising:
a second processor configured to receive the plurality of pieces of subgroup data from the first buffer, generate the plurality of pieces of integrity data for the plurality of pieces of subgroup data, and sequentially store the plurality of pieces of integrity data in the second buffer.

5. The error correcting circuit of claim 4, wherein
the second processor is further configured to determine whether each of the plurality of pieces of subgroup data satisfies a predetermined conditional expression and sequentially store in the second buffer a plurality of pieces of syndrome data generated based on a determination result of the second processor.

6. The error correcting circuit of claim 5, wherein
the first processor is further configured to output a correction stop signal to the decoder based on the plurality of pieces of syndrome data stored in the second buffer when there is no error present in the plurality of pieces of subgroup data.

7. The error correcting circuit of claim 4, wherein
the second processor is further configured to perform a cyclic redundancy check (CRC) operation on each of the plurality of pieces of subgroup data and sequentially store in the second buffer a plurality of pieces of sub-CRC data that is generated by performing the CRC operation.

8. The error correcting circuit of claim 7, wherein
the user data includes first CRC data, and
the first processor is further configured to receive the first CRC data and the plurality of pieces of sub-CRC data and output a correction stop signal to the decoder based on the first CRC data and second CRC data generated based on the plurality of pieces of sub-CRC data.

9. The error correcting circuit of claim 8, wherein
the first processor is further configured to output the correction stop signal to the decoder when the first CRC data is identical to the second CRC data, and
the first processor is further configured not to output the correction stop signal to the decoder when the first CRC data is not identical to the second CRC data.

10. An error correcting circuit, comprising:
a decoder configured to sequentially generate a plurality of pieces of integrity data for each of a plurality of pieces of subgroup data obtained by dividing a codeword and repeatedly perform an error correction operation on user data using a parity code,
wherein the codeword includes the user data and the parity code, and the error correcting circuit is configured to receive the codeword and perform the error correction operation on the codeword; and
a first processor configured to determine whether an error is present in the codeword based on the plurality of pieces of integrity data,
wherein the decoder is further configured to stop the error correction operation performed on the codeword based on a determination result of the first processor.

11. The error correcting circuit of claim 10, wherein
the decoder is further configured to sequentially regenerate the plurality of pieces of integrity data for each of the plurality of pieces of subgroup data obtained by dividing the codeword when it is determined that an error is present in the codeword, and
output the codeword when it is determined that no error is present in the codeword.

12. The error correcting circuit of claim 10, wherein
the first processor is further configured to output a correction stop signal to the decoder when there is no error present in the codeword, and
the decoder is further configured to output the codeword without performing an error determination for the codeword in response to the correction stop signal.

13. The error correcting circuit of claim 10, further comprising:
a second processor configured to receive the plurality of pieces of subgroup data and generate the plurality of pieces of integrity data for the plurality of pieces of subgroup data.

14. The error correcting circuit of claim 13, wherein
the second processor is further configured to determine whether each of the plurality of pieces of subgroup data satisfies a predetermined conditional expression and sequentially generate a plurality of pieces of syndrome data based on a determination result of the second processor, and
the first processor is further configured to output a correction stop signal to the decoder based on the plurality of pieces of syndrome data when there is no error present in the plurality of pieces of subgroup data.

15. The error correcting circuit of claim 13, wherein
the second processor is further configured to perform a cyclic redundancy check (CRC) operation on each of the plurality of pieces of subgroup data and sequentially generate a plurality of pieces of sub-CRC data based on a result of the CRC operation,
the user data includes first CRC data, and
the first processor is further configured to receive the plurality of pieces of sub-CRC data and the first CRC data and output a correction stop signal based on the first CRC data and second CRC data,
wherein the second CRC data is generated based on the plurality of pieces of sub-CRC data.

16. An error correcting method, comprising:
receiving, by an error correcting circuit, a codeword including user data and a parity code;
storing, by the error correcting circuit, the codeword in a first buffer;
generating, by the error correcting circuit, a plurality of pieces of integrity data for each of a plurality of pieces of subgroup data obtained by dividing the codeword;
sequentially storing, by the error correcting circuit, the plurality of pieces of integrity data in a second buffer; and
determining, by the error correcting circuit, whether an error is present in the codeword based on the plurality of pieces of integrity data stored in the second buffer when at least one of the plurality of pieces of integrity data is updated in the second buffer.

17. The error correcting method of claim 16, further comprising:
   storing the codeword in the first buffer when it is determined that an error is present in the codeword; and
   outputting the codeword to a host when it is determined that no error is present in the codeword.

18. The error correcting method of claim 16, further comprising:
   outputting the codeword to a host when it is determined that no error is present in the codeword.

19. The error correcting method of claim 16, wherein generating the plurality of pieces of integrity data comprises:
   determining whether each of the plurality of pieces of subgroup data satisfies a predetermined conditional expression; and
   generating the plurality of pieces of integrity data using a plurality of pieces of syndrome data generated as a result of determining whether the predetermined conditional expression is satisfied.

20. The error correcting method of claim 16, wherein generating the plurality of pieces of integrity data comprises:
   performing a cyclic redundancy check (CRC) operation on each of the plurality of pieces of subgroup data; and
   generating the plurality of pieces of integrity data using a plurality of pieces of sub-CRC data generated as a result of performing the CRC operation, wherein the user data includes first CRC data,
   wherein determining whether an error is present in the codeword comprises:
   receiving the plurality of pieces of sub-CRC data and the first CRC data;
   generating second CRC data based on the plurality of pieces of sub-CRC data; and
   determining whether an error is present in the codeword based on the second CRC data and the first CRC data.

* * * * *